United States Patent [19]

Kragl et al.

[11] Patent Number: 5,574,806
[45] Date of Patent: Nov. 12, 1996

[54] HYBRID INTEGRATED OPTICAL CIRCUIT AND DEVICE FOR EMITTING LIGHT WAVES

[75] Inventors: Hans Kragl, Ober-Ramstadt; Wolf-Henning Rech, Griesheim, both of Germany

[73] Assignee: Robert Bosch GmbH, Stuttgart, Germany

[21] Appl. No.: 519,223

[22] Filed: Aug. 25, 1995

Related U.S. Application Data

[62] Division of Ser. No. 295,915, Sep. 13, 1994, Pat. No. 5,475,775.

[30] Foreign Application Priority Data

Jan. 13, 1993 [DE] Germany ............ 43 00 652.3

[51] Int. Cl.[6] .................................. G02B 6/12
[52] U.S. Cl. ................ 385/14; 385/31; 385/39; 385/88; 385/92; 385/94; 385/131; 385/132; 385/51; 385/52
[58] Field of Search ................ 385/14, 15, 31, 385/39, 51, 52, 88, 89, 92, 94, 131, 132; 264/1.1, 1.24, 1.25, 2.7; 437/51, 209, 211, 219

[56] References Cited

U.S. PATENT DOCUMENTS

| | | | |
|---|---|---|---|
| 4,732,446 | 3/1988 | Gipson et al. | 385/14 X |
| 4,735,677 | 4/1988 | Kawachi et al. | 156/633 |
| 4,750,799 | 6/1988 | Kawachi et al. | 385/14 X |
| 5,030,321 | 7/1991 | Coutandin et al. | 156/643 |
| 5,035,483 | 7/1991 | Waitl et al. | 385/14 X |
| 5,119,451 | 6/1992 | Wills et al. | 385/14 |
| 5,123,066 | 6/1992 | Acarlar | 385/14 |
| 5,179,609 | 1/1993 | Blonder et al. | 385/89 |
| 5,230,990 | 7/1993 | Iwasaki et al. | 430/321 |
| 5,262,656 | 11/1993 | Blondeau et al. | 372/50 X |
| 5,265,184 | 11/1993 | Lebby et al. | 385/132 |
| 5,319,725 | 6/1994 | Buchmann et al. | 385/14 |
| 5,343,544 | 8/1994 | Boyd et al. | 385/46 |
| 5,359,687 | 10/1994 | McFarland et al. | 385/49 |
| 5,367,593 | 11/1994 | Lebby et al. | 385/53 |
| 5,475,775 | 12/1995 | Kragl et al. | 385/14 |

OTHER PUBLICATIONS

M. Hamacher, A Novel Fibre/Chip Coupling Technique With An Integrated Strain Relief On InP, ECOC 92, Berlin, pp. 537–540.
Jackson, Flip/Chip, Self–Aligned, Optoelectronic Transceiver Module, ECOC 92, Berlin, pp. 329–332.

Primary Examiner—Brian Healy
Attorney, Agent, or Firm—Kenyon & Kenyon

[57] ABSTRACT

A method for producing a hybrid integrated optical circuit which utilizes a molding tool having holding devices for an electrooptic semiconductor component and negative molds for a waveguide trench and holding devices for an optical waveguide. The holding devices of the molding tool adjust the electrooptic semiconductor component with respect to the negative mold of the waveguide trench during reshaping with a polymer. The basic unit produced consists of the electrooptic semiconductor component, which is adjusted with respect to the waveguide trench molded in the polymer. Adjoining the waveguide trench are holding devices, which are molded in the polymer and by means of which an optical waveguide can be coupled to the waveguide trench in a self-adjusting fashion. The basic unit and the optical waveguide are permanently connected to one another with the aid of a cover, the waveguide trench being filled with an optically transparent material, as a result of which a waveguide is formed.

6 Claims, 3 Drawing Sheets

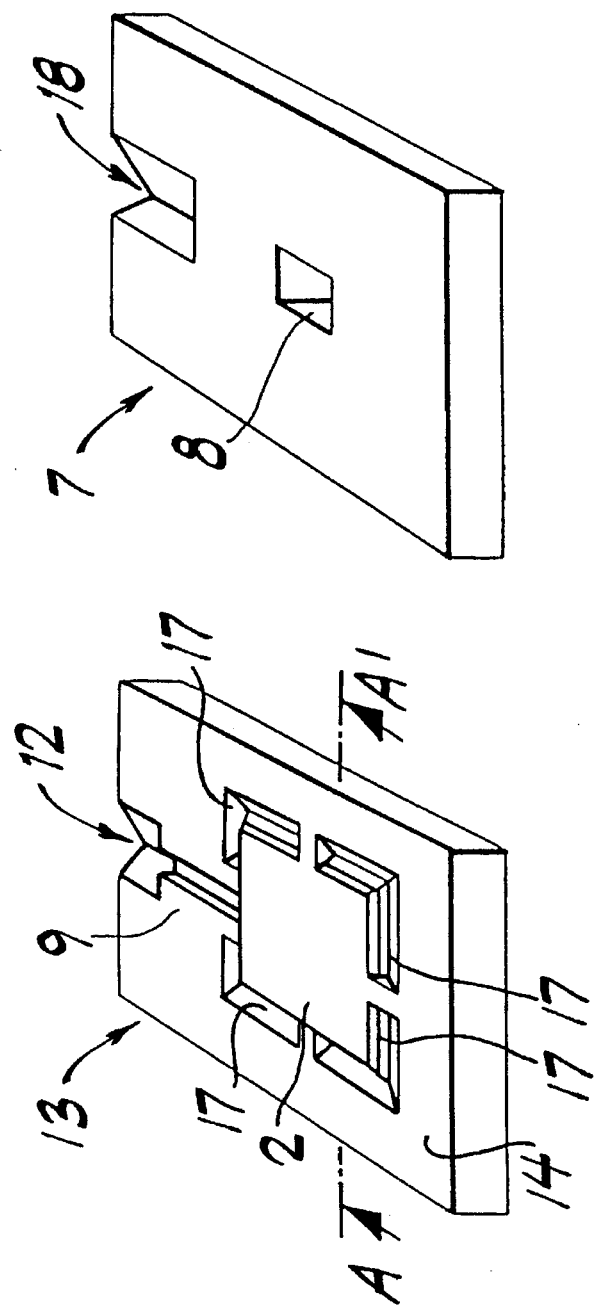
Fig. 2A
Fig. 2B
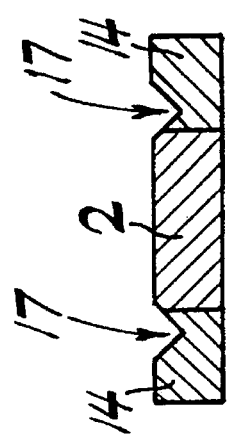
Fig. 2C

HYBRID INTEGRATED OPTICAL CIRCUIT AND DEVICE FOR EMITTING LIGHT WAVES

This application is a division of application Ser. No. 08/295,915, filed on Sep. 13, 1994, now U.S. Pat. No. 5,475,775.

FIELD OF THE INVENTION

The present invention relates to a method for producing a hybrid integrated optical circuit. A method is already known in which a glass fiber is coupled to a waveguide which has been inserted into an indium phosphide chip. In order to be able to couple the glass fiber in an adjusted state to the waveguide prepared for coupling, it is necessary to etch a V-shaped trench into the indium phosphide chip. Furthermore, the adjustment of the glass fiber must be done manually under a microscope so that the coupling losses occurring due to defective adjustment are kept as low as possible. (M. Hamacher, A novel fibre/chip coupling technique with an integrated strain relief on InP, ECOC 92, Berlin, pages 537 ff.) This method is time-consuming and expensive and cannot be applied to mass production.

Furthermore, a method is known in which a laser chip is adjusted on an integrated optical circuit with respect to waveguides with the aid of spacers and adjusting devices. However, this method requires the laser chip to be structured by means of etching operations for the purpose of holding the spacers and the adjusting devices. Furthermore, the spacers and the boundaries must be applied to the integrated optical circuit. This is very expensive however, since the spacers and the adjusting devices have to be produced and positioned with high accuracy. In addition, the laser chip must be inserted manually into the adjusting devices. (Jackson, Flip/Chip, Self-Aligned, Optoelectronic Transceiver Module, ECOC 92, Berlin, pages 329 ff.).

SUMMARY OF THE INVENTION

The method according to the present invention has the advantage that the adjustment of the electrooptic semiconductor component to the waveguide and the adjustment of the waveguide to the optical waveguide is performed without additional outlay when molding the basic unit, which consists of the electrooptic semiconductor component and the molded polymer. A time-consuming manual adjustment is thereby avoided.

The production of differently constructed integrated optical circuits is possible by using a molding tool which can be produced galvanically in many shapes simply and cost-effectively. The simple molding operation, in which the electrooptic semiconductor component is coupled in a self-adjusting fashion to the waveguide trench, is suitable for automated mass production. Integrated optical circuits can thereby be produced cost-effectively.

It is particularly advantageous that the side walls of the holding devices of the molding tool according to the present invention, which bound the space for the electrooptic semiconductor component to be accommodated, and the side walls of the electrooptic semiconductor component extend inwards in a beveled fashion. As a result, the sides of the holding device and those of the electrooptic semiconductor component slide against one another during the insertion of the electrooptic semiconductor component. The area for holding the electrooptic semiconductor component decreases continuously with decreasing distance from the molding tool, as a result of which the insertion of the electrooptic semiconductor component into the holding devices is simplified and a self-adjustment of the electrooptic semiconductor component is performed during insertion. As a result, electrooptic semiconductor components having a relatively large tolerance in the dimensions can be coupled to the waveguide trench with a minimum adjustment error.

It is particularly advantageous for the basic unit and an optical waveguide according to the present invention to be permanently connected to one another with the aid of a cover, preferably made from polymer, the waveguide trench being filled with an optically conductive, relatively high-index material, preferably with polymer. The cover has self-adjusting holding devices for the adjustment of the optical waveguide. A waveguide is produced in this way accompanied by filling the waveguide trench with a polymer. At the same time, the polymer is used to connect the cover to the basic unit. The self-adjusting holding devices of the cover simplify the adjustment of the optical waveguide with respect to the waveguide trench. They are, moreover, advantageous whenever the cover contains elements which influence or detect the optical field.

Openings are provided or produced subsequently by means of laser ablation in the cover for particularly simple electrical contacting of the electrooptic semiconductor component. Contacts for high currents can be attached in this way to the electrooptic semiconductor component. Alternatively, conductor tracks are sputtered or vapor deposited onto the polymer surface for electrical contacting of the electrooptic semiconductor component.

These types of electrical contacting are technically easy to master, cost-effective and compatible with many production methods.

An extension of the methods according to the present invention consists in preferably making use as electrooptical semiconductor component of laser diodes, laser diode arrays, laser diode amplifiers, laser diode amplifier arrays, semiconductor modulators, semiconductor demodulator arrays, detectors and detector arrays. As a result, differently constructed integrated optical circuits can be produced using the same method.

Another extension of the method according to the present invention consists in attaching a thermoelectric component in the region of the electrooptic semiconductor component in such a way that the refractive index of the waveguide can be varied.

It is particularly advantageous to construct the waveguide as a lateral continuous and/or segmented taper. It is therefore possible in the method for producing the basic unit simultaneously to construct a taper which expands the light spot emitted by the electrooptic semiconductor component, and thus reduce the coupling losses on the optical waveguide. The construction of the waveguide as a laterally continuous and/or segmented taper can be carried out economically with the aid of the molding operation in a simple way and without a further machining process.

An improvement of the method according to the present invention consists in coupling the carrier plate to a heat sink, preferably a Peltier element. The heat generated by the electrooptic semiconductor component is dissipated therewith.

It is advantageous for a compact integration of a hybrid integrated optical circuit when the heat sink is configured as a silicon plate to which electronic circuit arrangements are applied. The result is a higher integration and a reduction in the dimensions of the overall component.

BRIEF DESCRIPTION OF THE DRAWINGS

Exemplary embodiments of the invention are

FIG. 2A shows a basic unit in accordance with the present invention.

FIG. 2B shows a cross section of a basic unit in accordance with the present invention.

FIG. 2C shows a cover plate in accordance with the present invention.

DETAILED DESCRIPTION OF THE INVENTION

Figure 1:
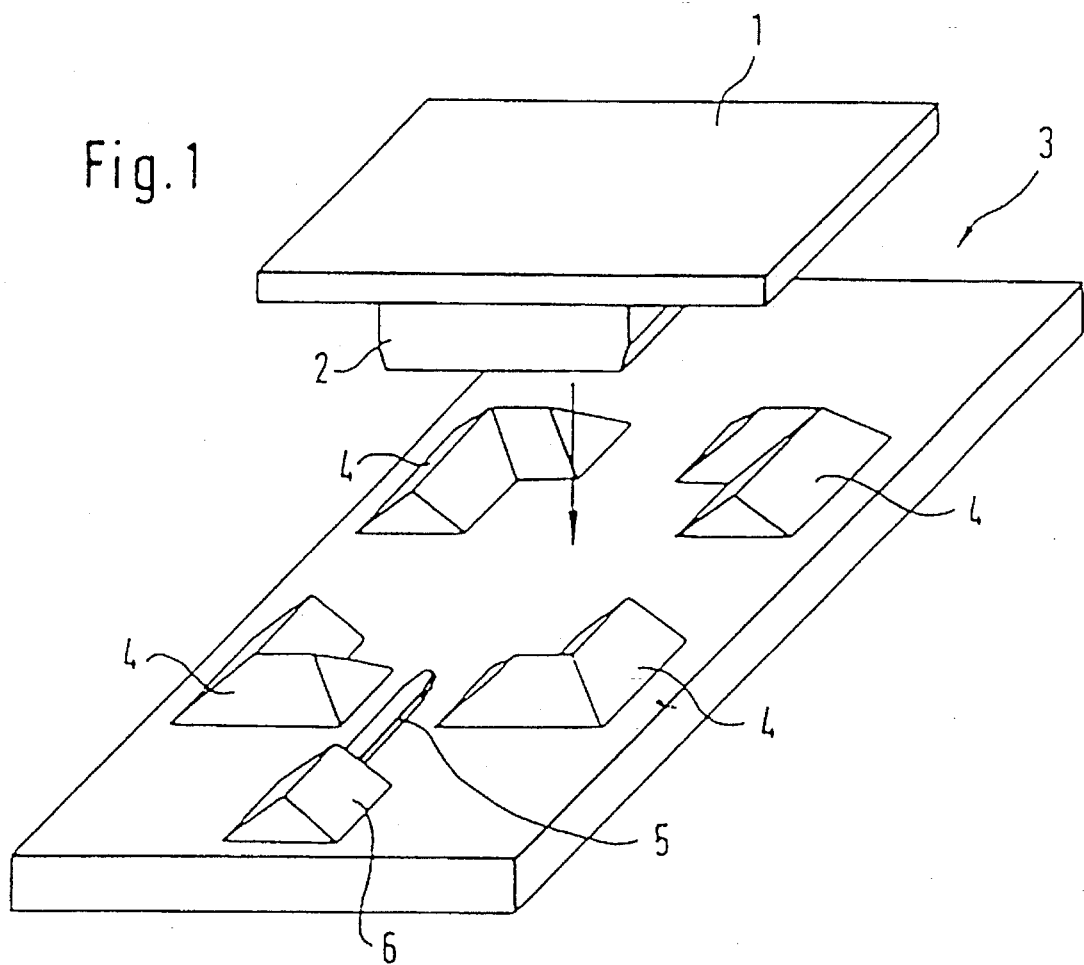
FIG. 1 shows a molding tool having an electrooptic semiconductor component in accordance with the present invention.

Represented in FIG. 1 is an electrooptic semiconductor component 2 which is applied to a carrier plate 1. FIG. 1 also shows a molding tool 3 having holding devices 4, a negative mold 5 for a waveguide trench 9 and a further negative mold 6 for a holding device 12 for an optical waveguide 10. The molding tool 3 having the holding devices 4 and the negative molds 5, 6 preferably consists of a metal that can be molded galvanically, such as nickel, for example. The holding devices 4 and the negative mold 5 of the waveguide trench 9 and the negative mold 6 for the holding device 12 are aligned with respect to one another such that upon insertion of the electrooptic semiconductor component 2 into the holding devices 4 the exit region of the light generated by the electrooptic semiconductor component 2 is coupled in an optimally adjusted fashion to the waveguide trench 9 molded by the negative mold 5.

It is particularly important to prevent a lateral offset of the negative mold 5 with respect to the exit region of the light beam. Consequently, the holding devices 4 must fix the position of the electrooptic semiconductor component 2 with the highest accuracy in the transverse direction relative to the negative mold 5.

For this purpose, the electrooptic semiconductor component 2 must have a defined width of low tolerance. The accuracy of the adjustment is increased by providing that those side walls of the holding devices 4 of the molding tool 3 which extend parallel to the negative mold 5, and the side walls of the electrooptic semiconductor component 2 extend inwards at least partially slightly obliquely, with the result that the distance to the holder of the electrooptic semiconductor component 2 decreases between the sides of the holding devices 4 with decreasing distance from the molding tool 3.

FIGS. 2A–2C shows the basic unit 13, which consists of an electrooptic semiconductor component 2 which is embedded in a molded material 14. The molding tool 3 has molded in the molded material 14 a waveguide trench 9, recesses 17 and a holding device 12 for an optical waveguide 10, which device is self-adjusting with respect to the waveguide trench 9. The recesses 17 have been embossed into the material 14 by the holding devices 4 of the molding tool 3, which are used to hold and adjust the inserted electrooptic semiconductor component 2 with respect to the waveguide trench 9. The cross section A–A' through the basic unit 13, shown in FIG. 2C, clearly shows the structure of the recesses 17 and the beveling of the lateral faces of the electrooptic semiconductor component 2. The recesses 17 are arranged about the electrooptic semiconductor component 2 in such a way that the alignment of the electrooptic semiconductor component 2 with the waveguide trench 9 is fixed. The waveguide trench 9 adjoins the light-emitting region of the electrooptic semiconductor component 2. The holding device 12 for the optical waveguide 10 adjoins the waveguide trench 9. This holding device 12 is preferably configured as a V trench. As a result of this shaping, a simple and precise adjustment of the optical waveguide 10 is achieved with respect to the waveguide trench 9.

Also represented in FIG. 2B is a cover 7 which has preferably been molded from the same material as the basic unit 13. The cover 7 has a contact opening 8 for electrically contacting the electrooptic semiconductor component 2, and a holding device 18 for the optical waveguide 10. The holding device 18 of the cover 7 is constructed for the purpose of holding the optical waveguide 10 as a V trench in this selected example.

Figure 3:
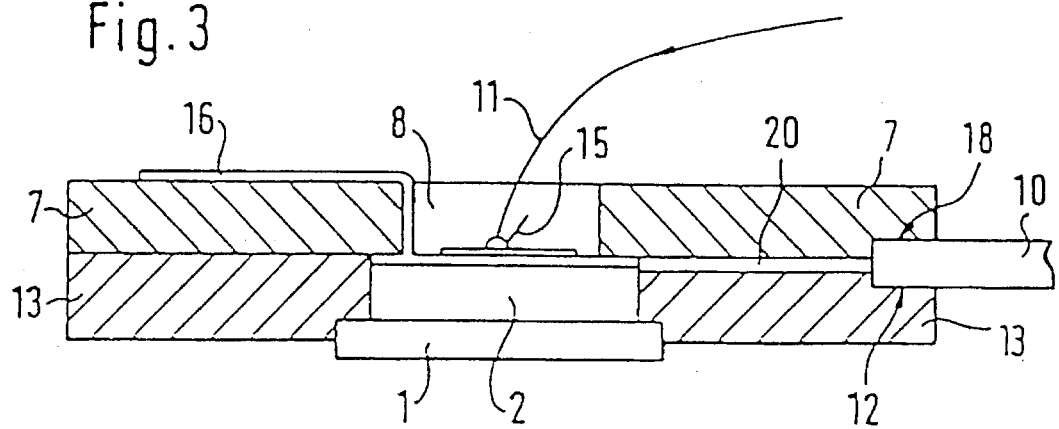
FIG. 3 shows a section through an integrated optical circuit in accordance with the present invention.

FIG. 3 shows a section through an integrated optical circuit, consisting of a basic unit 13 which is permanently connected to a cover 7. Furthermore, an optical waveguide 10 is coupled to the waveguide 20. A contact wire 11 is attached to the electrooptic semiconductor component 2 via the contact opening 8. In addition, the electrooptic semiconductor component 2 can be contacted by means of sputtered-on conductor tracks 16 as represented in FIG. 3. The waveguide trench 9 is filled with an optically transparent material having a higher refractive index than the refractive index of the material 14, preferably with a polymer, and thus forms the waveguide 20. The exit region of the light of the electrooptic semiconductor component 2 is coupled to the waveguide 20. The optical waveguide 10 is permanently connected to the integrated optical circuit via the holding devices 12 of the basic unit 13 and the holding device 18 of the cover 7, and coupled to the waveguide 20.

Figure 4A:
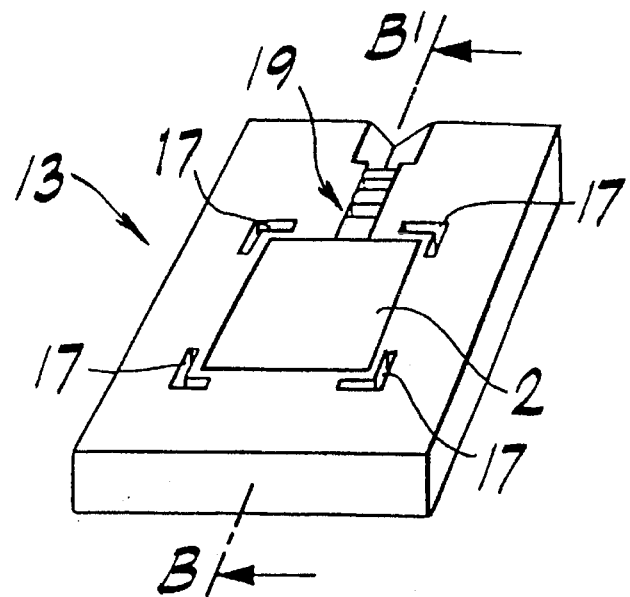
FIG. 4A shows a basic unit having a segmented taper in accordance with the present invention.
Figure 4B:
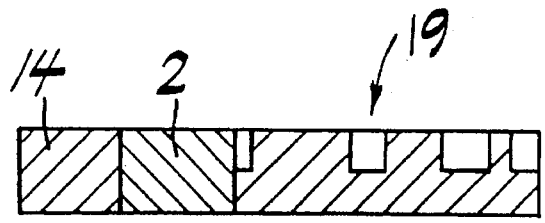
FIG. 4B shows a cross section through a basic unit having a segmented taper in accordance with the present invention.

FIG. 4A–4B show a basic unit 13 having a waveguide trench 9 which is constructed as a segmented taper. The cross section B–B' illustrated in FIG. 4B, shows the structure of the segmented taper. Represented in this example is a two-dimensional taper, such as described in Z. Weissmann, "2-D Mode Tapering Via Tapered Channel Waveguide Segmentation", Electronics Letters, Vol. 28, No. 16, 1992, pages 1514 ff. The segmented taper 19 expands the diameter of the light beam emitted by the electrooptical semiconductor component 2. As a result, when the light beam is coupled into the optical waveguide 10, the coupling losses are reduced owing to the better matching of the spot diameter. The waveguide trench 9 can preferably also be constructed as a three-dimensional taper.

Figure 5:
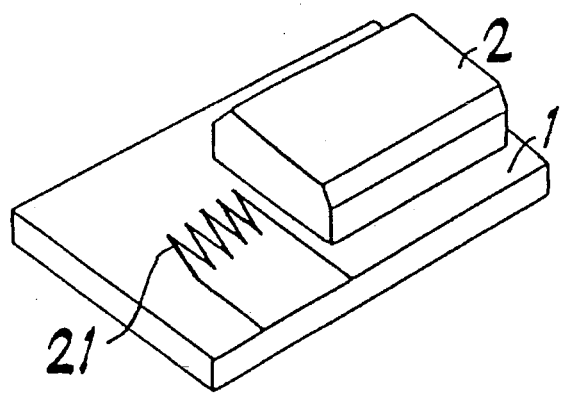
FIG. 5 shows an integrated optical circuit having a thermoelectric component in accordance with the present invention.

FIG. 5 shows a carrier plate 1 which apart from an electrooptic semiconductor component 2 carries a thermoelectric component 21. The thermoelectric component 21 is embedded in a basic unit 13 in the same way as the electrooptic semiconductor component 2. The refractive index of one or more waveguides 20, which extend in the vicinity of the thermoelectric component 21, can be varied with the aid of the thermoelectric component 21.

The method according to the present invention is explained in more detail with the aid of FIGS. 1 to 5. In order to produce the basic unit 13, the electrooptic semiconductor component 2, which is mounted on a carrier plate 1, is inserted into the holding devices 4 of the molding tool 3. In this case, the electrooptic semiconductor component 2 is adjusted with respect to the negative mold 5 of the waveguide trench 9 by the shape and alignment of the holding devices 4, with the result that lateral offsets and instances of tilting are prevented. Thereafter, the molding tool 3 and the inserted electrooptic semiconductor component 2 with the carrier plate 1 are encapsulated by a moldable material. The material used is preferably a polymer. The use of the molding tool 3 with the negative molds 5, 6 for a waveguide trench 9 and holding devices 12 for the optical waveguide 10 enable simple molding by means of injection-molding, injection-compression-molding or casting processes, it being preferable to use polymer plastics.

The holding devices 4 of the molding tool 3 can preferably be constructed in such a way that laser diodes, laser diode arrays, laser diode amplifiers, laser diode amplifier arrays, semiconductor modulators, semiconductor demodulator arrays, detectors and detector arrays are optically coupled in a self-adjusting fashion with respect to the waveguide 20.

This method permits a hybrid installation of electrooptic semiconductor components 2 in polymer, integrated optical circuits by the use of a self-adjusting method. After removal of the molding tool 3, a basic unit 13 is present which consists of an electrooptic semiconductor component 2 and a molded material 14. In this selected example, a waveguide trench 9 and a holding device 12 have been inserted into the polymer plastic by molding of the molding tool 3. As represented in FIG. 3, in this exemplary embodiment, an optical fiber or an optical fiber bundle is coupled as optical waveguide 10 to the waveguide 20.

In order to cover the electrooptic semiconductor component 2 and the waveguide trench 9, use is made of a cover 7 which can be produced, for example, from a polymer plastic with the aid of a molding tool. The cover 7 selected for this example has a contact opening 8 which is used for the electrical contacting of the electrooptic semiconductor component 2, and a holding device 18 which is used to adjust and mount the optical waveguide 10. The optical waveguide 10 is inserted into the holding device 12 of the basic unit 13 for the purpose of producing the integrated optical circuit. An optically transparent adhesive, preferably a polymer plastic, is applied to the basic unit 13, while the waveguide trench 9 and the recesses 17 are filled. The filling of the waveguide trench 9 with an optically transparent material having a refractive index higher than that of the material 14 produces a waveguide 20 from the waveguide trench 9. The cover 7 is laid onto the basic unit 13, with the result that the optical waveguide 10 is coupled in a self-adjusting fashion to the waveguide 20 from the holding device 18 of the cover 7 and the holding device 12 of the basic unit 13. The cover 7 is pressed against the basic unit 13, with the result that only a thin layer of the polymer plastic is located outside the waveguide trench 9 between the basic unit 13 and the cover 7, which layer produces the connection between the basic unit 13 and the cover 7 after curing of the polymer plastic.

As represented in FIG. 3, a contact wire 11 is bonded via the contact opening 8 to the electrooptic semiconductor component 2 for the purpose of electrical contacting. Given the use of a cover which has no contact opening 8, the opening required for electrical contacting can be inserted subsequently into the cover 7 by means of laser ablation. Preferably, a conductor track 16 can be sputtered on or vapor deposited for the purpose of electrically contacting the electrooptic semiconductor component 2. The production of the molding tool 3 in various shapes makes it possible not only for a specific electrooptic semiconductor component 2, but for various electrooptic semiconductor components such as, for example, laser diodes, laser diode arrays, laser diode amplifiers, laser diode amplifier arrays, semiconductor modulators, semiconductor demodulator arrays or detectors and detector arrays, to be reshaped simultaneously with a polymer plastic and embedded in a basic unit. Moreover, the molding of the waveguide trench 9 offers the possibility, as represented in FIG. 4, of constructing a segmented taper 19 in a simple way in one method step including the production of the basic unit 13.

The production of the segmented taper 19 is performed by filling the empty spaces, which remain in the waveguide trench 9 after the molding of the basic unit with a polymer. The polymer, which is used to fill the empty spaces, has a higher refractive index in comparison to the polymer plastic from which the basic unit 13 was molded.

Since it is impermissible for the active zone of the electrooptic semiconductor component 2, which produces the laser light as in the case of a laser diode, to be damaged during insertion of the electrooptic semiconductor component 2, it is advantageous to attach to the molding tool 3 spacers which prevent damage to the active zone. The carrier plate 1 serves as a heat sink, and can preferably be coupled to a Peltier element.

Furthermore, a silicon plate having electronic circuit arrangements can be used as the carrier plate 1. The conductor tracks 16 vapor deposited or sputtered onto the cover 7 are to be applied at an appropriate thickness, so that the current intensities required to operate the electrooptic semiconductor component 2 can be supplied without heating the conductor tracks 16.

What is claimed is:

1. A device for emitting light waves, comprising:

at least one electrooptic semiconductor component having a plurality of sides; and a molded material molded to the at least one electrooptic semiconductor component, the molded material including at least one recess disposed alongside at least one of the plurality of sides of the at least one electrooptic semiconductor component to align the at least one electrooptic semiconductor component with a waveguide trench.

2. The device set forth in claim 1, wherein the at least one electrooptic semiconductor includes a light-emitting zone, and wherein the molded material includes the waveguide trench, the waveguide trench having a first end and a second end, the first end adjoining the light-emitting zone of the at least one electrooptic semiconductor component and the second end adjoining a first holding device for holding an optical waveguide.

3. The device set forth in claim 2, further comprising a cover connected to the at least one electrooptic semiconductor component, the cover having at least one second holding device for holding the optical waveguide, and wherein the waveguide trench is filled with an optically transparent material, thereby forming a waveguide, the waveguide being optically coupled to the optical waveguide.

4. A device for emitting light waves, comprising:

at least one electrooptic semiconductor component having a plurality of sides and a light-emitting zone; and a molded material molded to the at least one electrooptic semiconductor component, the molded material including a recess disposed adjacent to the light-emitting zone, the recess being adapted to form a waveguide trench aligned with the light-emitting zone.

5. The device set forth in claim 4, wherein the waveguide trench has a first end and a second end, the first end adjoining the light-emitting zone of the at least one electrooptic semiconductor component and the second end adjoining a first holding device for holding an optical waveguide.

6. The device set forth in claim 5, further comprising a cover connected to the at least one electrooptic semiconductor component, the cover having a second holding device disposed opposite the first holding device for holding the optical waveguide, and wherein the waveguide trench is filled with an optically transparent material to form a waveguide, the waveguide being optically coupled to the optical waveguide.

* * * * *